United States Patent
Nakai et al.

(10) Patent No.: US 6,770,843 B2
(45) Date of Patent: Aug. 3, 2004

(54) LASER PROCESSING APPARATUS AND METHOD

(75) Inventors: Izuru Nakai, Toyonaka (JP); Toshiharu Okada, Ibaraki (JP); Haruhiro Yuki, Minoo (JP); Ken Muneyuki, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/892,651

(22) Filed: Jun. 28, 2001

(65) Prior Publication Data

US 2002/0000430 A1 Jan. 3, 2002

(30) Foreign Application Priority Data

Jun. 30, 2000 (JP) .................................. 2000-198168
Jun. 8, 2001 (JP) .................................. 2001-173389

(51) Int. Cl.[7] ............................................. B23K 26/06
(52) U.S. Cl. .......................... 219/121.73; 219/121.79; 219/121.8
(58) Field of Search ...................... 219/121.73, 121.75, 219/121.78, 121.79, 121.8, 121.81; 372/50, 20

(56) References Cited

U.S. PATENT DOCUMENTS

| | | | |
|---|---|---|---|
| 3,743,383 A | * 7/1973 | Giallorenzi | ................. 359/640 |
| 4,832,469 A | 5/1989 | Noguchi et al. | |
| 5,528,612 A | * 6/1996 | Scheps et al. | ................. 372/21 |
| 5,670,069 A | 9/1997 | Nakai et al. | |
| 5,914,978 A | * 6/1999 | Welch et al. | ................ 372/102 |
| 5,969,335 A | 10/1999 | Karasaki | |

* cited by examiner

Primary Examiner—Kiley Stoner
Assistant Examiner—Len Tran
(74) Attorney, Agent, or Firm—Greenblum & Bernstein, P.L.C.

(57) ABSTRACT

In a laser processing apparatus including a laser oscillator for emitting laser light onto a workpiece through an fθ lens for drilling a hole in the workpiece, a wavelength selector for passing only a light ray having a specific wavelength is disposed between the laser oscillator and the workpiece.

4 Claims, 4 Drawing Sheets

LASER PROCESSING APPARATUS AND METHOD

BACKGROUND OF THE INVENTION

The present invention relates to an apparatus and method for drilling holes in electronic circuit substrates using laser light.

FIG. 7 schematically shows the construction of a known laser processing apparatus, such as a $CO_2$ gas laser machining apparatus. Laser light 102 emitted from a laser oscillator 101 is guided onto a workpiece 107 for forming micropores therein. A galvanometer 104 swings as it reflects received laser light 102 onto an fθ lens 105 in a scanning manner. Thereupon, the fθ lens 105 converges the incident rays to form a focus spot 106 at a predetermined location on the workpiece 107.

In general, laser light emitted from such laser oscillator contains light rays of various wavelengths and of various intensities. For achieving a high degree of precision in laser machining, the presence of light of various differing wavelengths presents a problem, particularly when employing an fθ lens, which is highly liable to chromatic aberration.

That is, when the laser light, which contains a plurality of light rays having different wavelengths $\lambda 1, \lambda 2, \lambda 3$, is emitted toward the fθ lens, chromatic aberration tends to occur because of the differences in wavelength of the laser light, since the refraction index of the fθ lens differs depending on the wavelength. As a result, a plurality of focus spots are respectively formed by the discrete light rays of various wavelengths, as indicated by reference designators f1, f2, and f3 in FIG. 7. This is particularly so when the light incident position is spaced from the center of the fθ lens. The formation of a plurality of focus spots f1, f2, and f3 leads to unfavorable drilling results such as oval holes or a plurality of separate holes.

SUMMARY OF THE INVENTION

The present invention has been devised in light of the above-described problems encountered by the prior art, and it is an object of the invention to provide an improved laser processing method and an apparatus therefor, with which the formation of a plurality of or oval focus spots is inhibited, and drilling of favorable shapes is ensured.

A laser processing apparatus according to the invention includes:

a laser oscillator for emitting laser light;

an fθ lens positioned relative to the laser oscillator for converging the emitted laser light onto a workpiece; and a wavelength selector interposed between the laser oscillator and the fθ lens for separating a light ray having a specified wavelength out of the laser light.

By providing the wavelength selector between the laser oscillator and the fθ lens, a light ray having a specified wavelength is singled out from the laser light. The single light ray converged by the fθ lens forms only a single focus spot. Thus adverse effects of chromatic aberration caused by the fθ lens are eliminated, whereby the formation of deformed focus spots or a plurality of focus spots is inhibited, and the machining precision is enhanced.

These and other objects and characteristics of the present invention will become further clear from the following description with reference to the accompanying drawings.

DETAILED DESCRIPTION OF THE PREFERRED EMBODIMENTS

Preferred embodiments of the invention will be hereinafter described with reference to FIG. 1 through FIG. 6.

Figure 1:
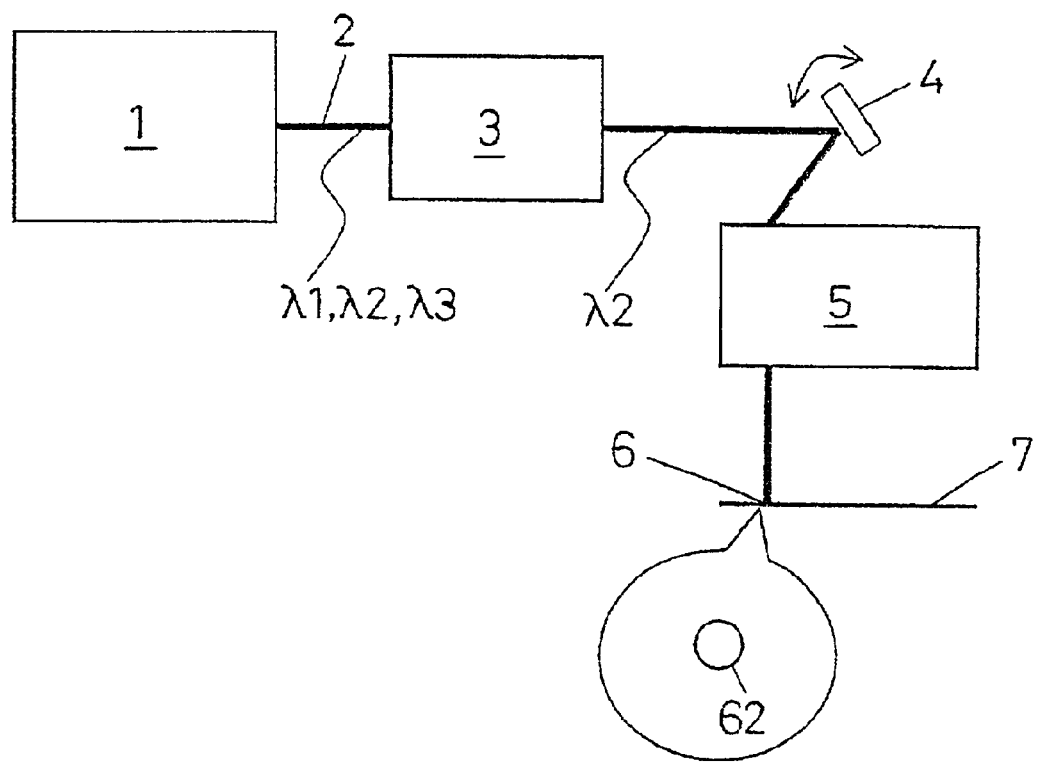
FIG. 1 is a schematic diagram illustrating the construction of a laser processing apparatus according to one embodiment of the present invention.

FIG. 1 is a schematic diagram illustrating a $Co_2$ gas laser processing apparatus for drilling holes in a workpiece 7, which is an electronic circuit substrate in this embodiment, by emitting laser light thereonto. A laser oscillator 1 emits laser light 2 containing rays of various different wavelengths $\lambda 1, \lambda 2, \lambda 3$ into a wavelength selector 3, which only passes light of specified wavelength $\lambda 2$. A galvanometer 4 rocks as indicated by the arrow in FIG. 1 so as to reflect received light into a fθ lens 5 in a scanning manner. The fθ lens 5 converges light to form a focus point 6 on the workpiece 7. Here, the focus point 6 takes the form of a true circle 62, because of the light having only the wavelength $\lambda 2$.

Figure 2:
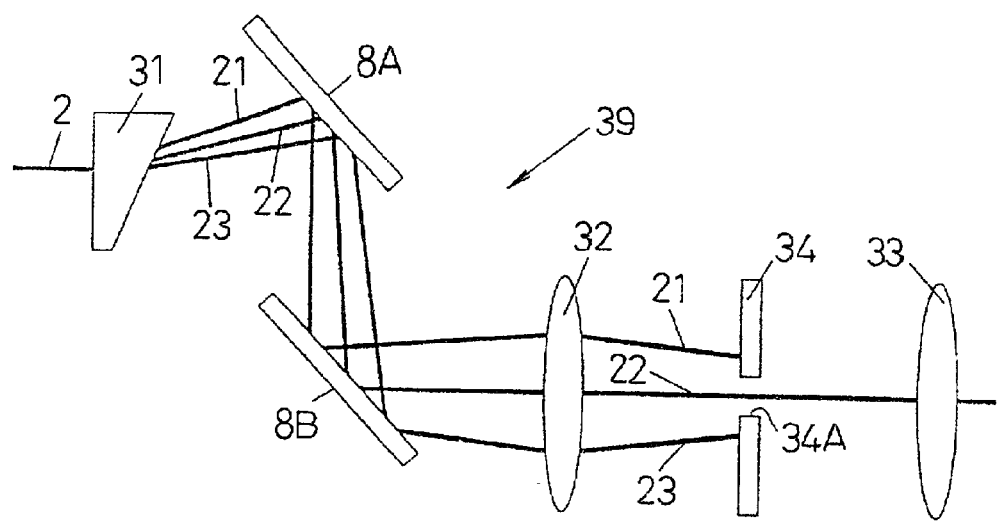
FIG. 2 is a schematic diagram illustrating a wavelength selector in one embodiment of the invention.

FIG. 2 is a conceptualized illustration of a wavelength selector 3 according to one embodiment of the invention. The wavelength selector 3 is mainly composed of a prism 31 and a spatial filter 39. The spatial filter 39 includes convex lenses 32, 33, which are focusing lenses, a shield 34 having a pin hole 34A, and reflection mirrors 8A, 8B.

The incident laser light 2 in the prism 31 disperses into light rays 21, 22, 23 having different light axes because of the differing reflective indexes depending on their respective wavelengths $\lambda 1, \lambda 2, \lambda 3$. The three light rays 21, 22, 23 are reflected by the reflection mirrors 8A and 8B into the convex lens 32, whereby three separate focus points are formed by the convex lens 32. The shield 34 is disposed such that the pin hole 34A is positioned for passing only the light ray 22 having the predetermined wavelength $\lambda 2$, so that the other two light rays 21, 23 are shielded. The laser light 22 having the wavelength $\lambda 2$ thus passes through the pin hole 34A and reaches the convex lens 33, by which it is emitted toward the galvanometer 4 shown in FIG. 1.

It is preferable to provide several ones of the above-described prism 31. By passing through the plurality of such prisms 31, separation of a desired one of light rays is more readily achieved.

Figure 3:
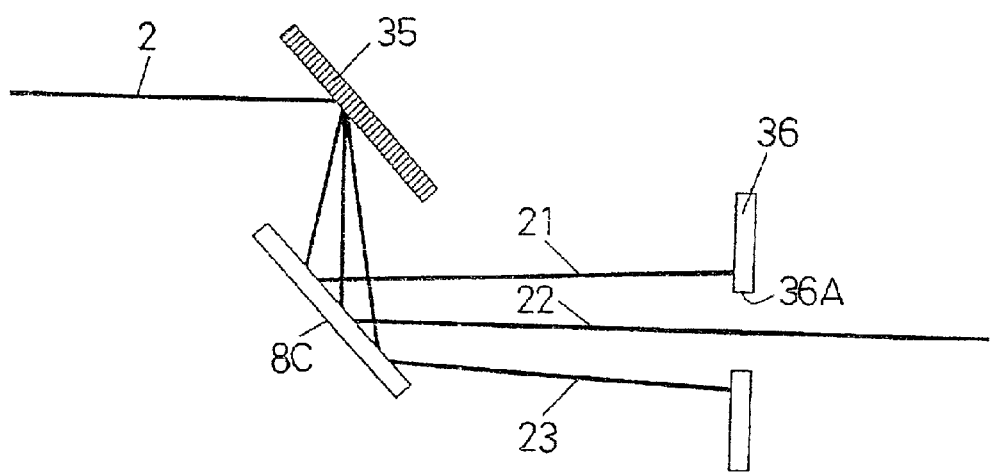
FIG. 3 is a schematic diagram illustrating a wavelength selector in another embodiment of the invention.

FIG. 3 shows a wavelength selector 3 according to another embodiment of the invention. The wavelength selector 3 of this embodiments is mainly composed of a diffraction grating 35, a reflection mirror 8C, and a shield 36 having an opening 36A.

The incident laser light 2 containing light of various wavelengths $\lambda 1, \lambda 2, \lambda 3$ is reflected by the diffraction grating 35 at various different angles in accordance with the wavelengths onto the reflection mirror 8C. The shield 36 is disposed such as to shield light rays 21, 23 while letting the light ray 22 pass through its opening 36A. If the light rays of different wavelengths are in proximity to each other and the shield 36 alone can hardly provide the function of selecting a specified light ray, the arrangement shown in FIG. 2 including the shield 34 having the pin hole 34A and the convex lenses 32 and 33 may be substituted for the shield 36.

Figure 4:
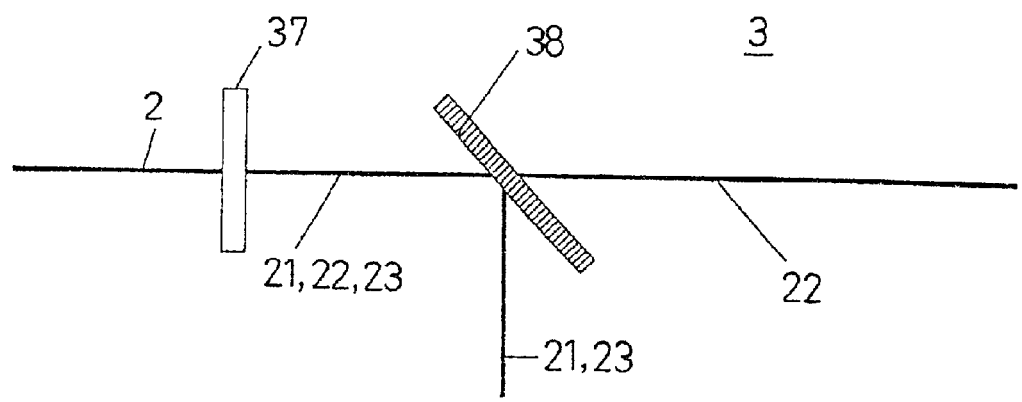
FIG. 4 is a schematic diagram illustrating a wavelength selector in yet another embodiment of the invention.

FIG. 4 shows a wavelength selector 3 according to yet another embodiment of the invention. The wavelength selector 3 of this embodiments is mainly composed of a wave plate 37 for polarizing laser light 2 into different phase shifts in accordance with the wavelengths, and a polarizer 38 for passing only the light polarized into a phase shift corresponding to a specified wavelength.

The difference in the phase shift of light rays of various wavelengths λ1, λ2, λ3 contained in the laser light 2 transmitting through the wave plate 37 appears as the difference in the transmittance at the polarizer 38. A wave plate of a multiple order can cause a distinct phase shift. Thus, by rotating the wave plate 37 within a surface having the light axis of the laser light 2 as a normal, specific light rays 21, 23 having unwanted wavelengths λ1, λ3 are reflected by the polarizer 38, so that only a desired one of light rays, having a specified wavelength λ2, passes straight through the polarizer 38.

Figure 5:
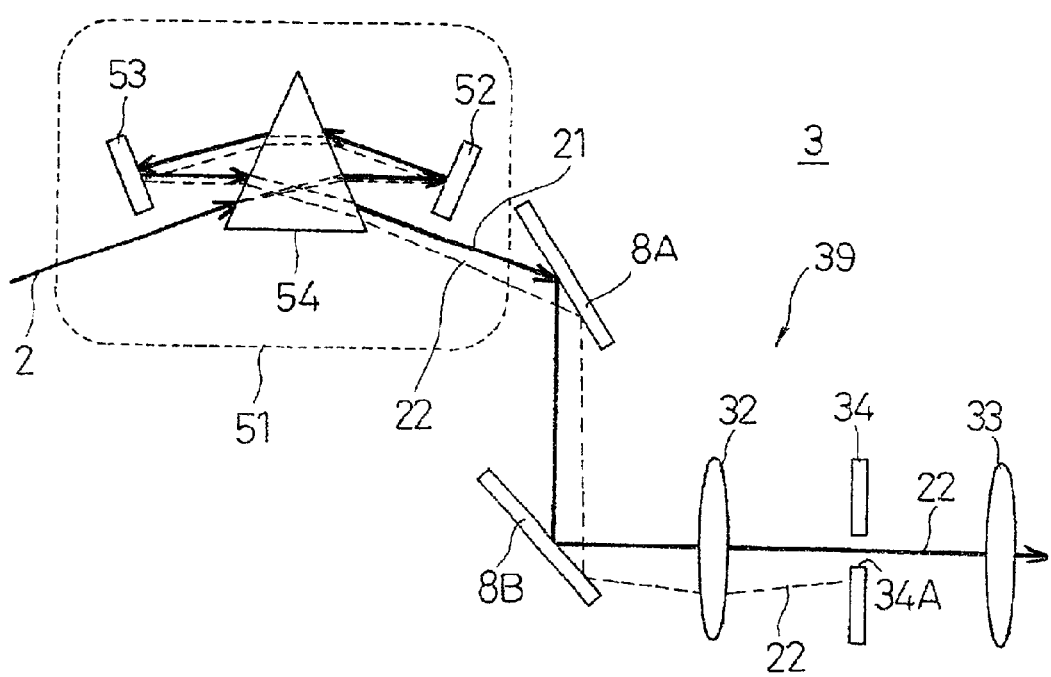
FIG. 5 is a schematic diagram illustrating a wavelength selector in a further embodiment of the invention.

FIG. 5 is a conceptualized illustration of a wavelength selector 3 according to a further embodiment of the invention, which is a modification of the above-described first embodiment of the invention illustrated in FIG. 2. According to this embodiment, laser light is passed through a prism not once but a number of times, so that the separation of a light ray having a specific wavelength is more precisely achieved. The wavelength selector 3 includes a spatial filter 39 similarly to the first embodiment, and a wavelength separation system 51 having a first and a second reflection mirrors 52, 53 and a prism 54 interposed between the reflection mirrors 52, 53.

The incident laser light 2 transmitting the prism 54 of the wavelength separation system 51 is reflected by the first reflection mirror 52 and reenters the prism 54. The laser light is then reflected by the second reflection mirror 53 to enter the prism 54 third time. Thus the laser light 2 is transmitted through the prism 54 three times before being emitted from the wavelength separation system 51.

In this embodiment, for ease of explanation, it is assumed that the laser light 2 contains two light rays 21, 22 having different wavelengths λ1, λ2. By passing through the prism 54 three times as described above, the incident laser light 2 is separated into two light rays 21, 22 having different light axes, because of the different refractive indexes.

Thus the laser light is separated into several light rays utilizing the prism 54 of which refractive index differs in accordance with the wavelength. Since the laser light is passed through the prism three times in this embodiment, separation of light rays becomes accordingly precise.

The light rays 21, 22 separated by the wavelength separation system 51 are reflected by the reflection mirrors 8A and 8B into the convex lens 32, whereby two separate focus points are formed by the convex lens 32. The shield 34 is disposed such that the pin hole 34A is positioned for passing only the light ray 22 having the predetermined wavelength λ2, so that the other light ray 21 is shielded. The laser light 22 having the wavelength λ2 thus passes through the pin hole 34A and reaches the convex lens 33, by which it is emitted as a parallel light ray toward the galvanometer 4 shown in FIG. 1.

Figure 6:
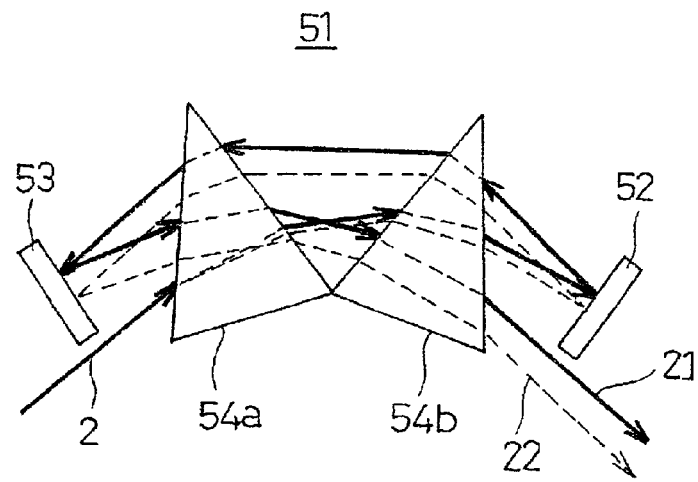
FIG. 6 is a schematic diagram illustrating a modified example of the wavelength selector of FIG. 5.
Figure 7:
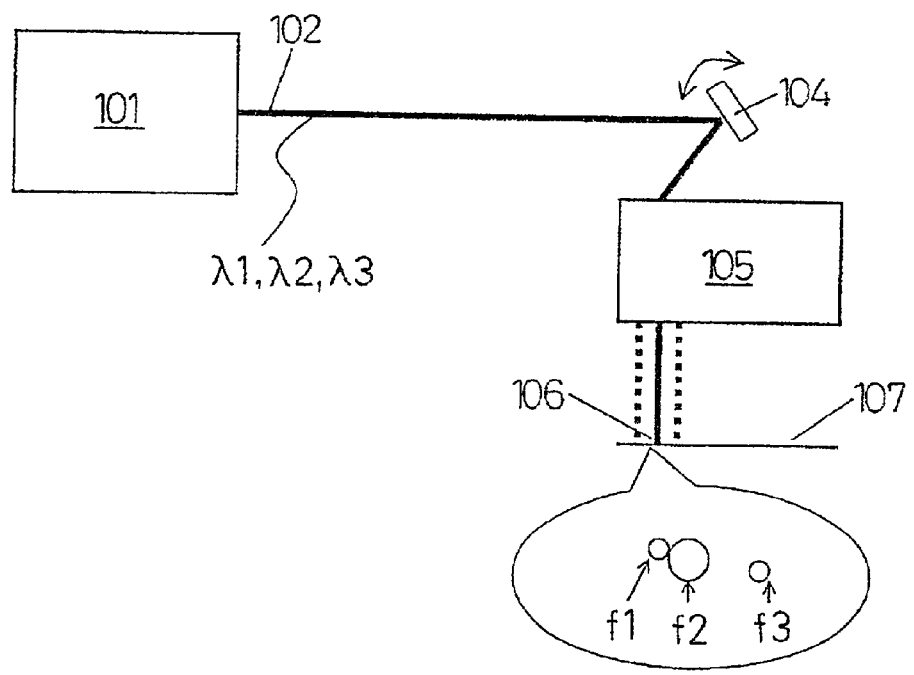
FIG. 7 is a schematic diagram illustrating the construction of a conventional laser processing apparatus.

FIG. 6 shows another modified example of the above-described wavelength separation system 51. As shown in the drawing, the wavelength separation system 51 may include two or more of the prisms 54a, 54b between the first and the second reflection mirrors 52, 53. Thereby, the incident laser light 2 is made to transmit through the prisms 54a and 54b six times as indicated by the solid line and the broken line in FIG. 6, and the light separation effect is accordingly improved.

As evident from the above, according to the present invention, adverse effects of chromatic aberration caused by the fθ lens are eliminated, whereby focus spots are prevented from being deformed or formed in plurality, ensuring higher degree of precision in laser machining.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A laser processing apparatus, comprising:
   a laser oscillator that emits laser light;
   an fθ lens positioned relative to the laser oscillator that converges said emitted laser light onto a workpiece; and
   a wavelength selector interposed between said laser oscillator and said fθ lens to separate a light ray having a specified wavelength out of said laser light, said wavelength selector including a prism disposed along a light axis of said laser light, and a spatial filter including a focusing lens and a shield with an aperture that passes only a light ray having a specified wavelength.

2. The laser processing apparatus according to claim 1, wherein the laser light is transmitted through the prism a plurality of times.

3. The laser processing apparatus according to claim 2, wherein said wavelength selector includes a pair of reflection mirrors, in which one reflection mirror of said pair of reflection mirrors, is positioned on either side of said prism to cause said laser light to pass through said prism more than once.

4. The laser processing apparatus according to claim 1, wherein the wavelength selector includes a plurality of prisms disposed along a light axis of the laser light, and a spatial filter having a focusing lens and a shield for passing only a light ray having a specified wavelength.

* * * * *